(12) United States Patent
Shin et al.

(10) Patent No.: US 7,755,396 B2
(45) Date of Patent: Jul. 13, 2010

(54) POWER NETWORK USING STANDARD CELL, POWER GATING CELL, AND SEMICONDUCTOR DEVICE USING THE POWER NETWORK

(75) Inventors: Youngsoo Shin, Daejeon (KR); Hyung-Ock Kim, Seoul (KR)

(73) Assignee: Korea Advanced Institute of Science and Technology, Daejeon (KR)

(*) Notice: Subject to any disclaimer, the term of this patent is extended or adjusted under 35 U.S.C. 154(b) by 322 days.

(21) Appl. No.: 11/741,995

(22) Filed: Apr. 30, 2007

(65) Prior Publication Data
US 2008/0012424 A1 Jan. 17, 2008

(30) Foreign Application Priority Data
May 11, 2006 (KR) .................. 10-2006-0042341

(51) Int. Cl.
*H01L 25/00* (2006.01)
*H03K 19/00* (2006.01)
(52) U.S. Cl. .................. 326/101; 326/33; 327/544; 257/207
(58) Field of Classification Search .................. 326/33, 326/38, 81, 101; 327/544, 565; 716/1, 10, 716/11, 13; 257/207, 371
See application file for complete search history.

(56) References Cited

U.S. PATENT DOCUMENTS

| 2004/0070427 | A1* | 4/2004 | Miyagi | 327/100 |
| 2005/0104133 | A1* | 5/2005 | Kanno et al. | 257/371 |
| 2007/0164806 | A1* | 7/2007 | Gasper et al. | 327/389 |
| 2007/0168899 | A1* | 7/2007 | Frenkil | 716/10 |

OTHER PUBLICATIONS

Kim, H., Shin, Y., Kim, H., and Eo, I. 2006. Physical design methodology of power gating circuits for standard-cell-based design. In Proceedings of the 43rd Annual Conference on Design Automation (San Francisco, CA, USA, Jul. 24-28, 2006). DAC '06. ACM, New York, NY, 109-112. DOI= http://doi.acm.org/10.1145/1146909.1146942.*

* cited by examiner

*Primary Examiner*—Rexford N Barnie
*Assistant Examiner*—Jany Tran
(74) *Attorney, Agent, or Firm*—Daly, Crowley, Mofford & Durkee, LLP

(57) ABSTRACT

A low power semiconductor memory device using a power gating is disclosed. The semiconductor memory device includes a standard cell and a power gating cell. The standard cell is provided with a virtual supply voltage and a first supply voltage. The power gating cell generates the virtual supply voltage from a second supply voltage and provides the standard cell with the virtual supply voltage in response to a control signal. The virtual supply voltage and the first supply voltage are provided by a first metal layer and the second supply voltage is provided by a third metal layer. The power gating cell may include at least one slice block and isolator blocks. The respective slice block has a transistor for switching current. The isolator blocks are arranged on both sides of the slice block and insulate the slice block from outside.

6 Claims, 3 Drawing Sheets

50

POWER NETWORK USING STANDARD CELL, POWER GATING CELL, AND SEMICONDUCTOR DEVICE USING THE POWER NETWORK

CROSS-REFERENCE TO RELATED APPLICATIONS

This application claims priority under 35 USC §119 to Korean Patent Application No. 10-2006-0042341, filed on May 11, 2006 in the Korean Intellectual Property Office (KIPO), the disclosure of which is incorporated herein by reference in its entirety.

BACKGROUND OF THE INVENTION

1. Field of the Invention

The present invention relates to power gating, and more particularly to a power network using a standard cell, a power gating cell and a semiconductor device using the power network.

2. Description of the Related Art

Recently, according to demand of market, electronic products have been developed for having a smaller size, a longer operating time, a bigger capacity and more functions. Particularly, low power and small size are essential to portable electronic products. Thus, semiconductor devices employed in the portable electronic products need to be low-powered and small-sized.

When a manufacturing process becomes elaborate and the power supply voltage is lowered, the size of the semiconductor devices can be reduced. In the semiconductor devices having a small size, however, a leakage current is increased in a standby mode and an operating speed is difficult to be increased in an active mode. To solve the above problems, multi threshold-voltage complementary metal oxide semiconductor (MTCMOS) has been proposed. A power consumption control method using the MTCMOS is referred to as a power gating. When a power network that adopts the power gating using the MTCMOS is used, the semiconductor devices can reduce the leakage current in a standby mode. FIG. 1 is a circuit diagram illustrating a conventional MTCMOS circuit.

Referring to FIG. 1, the conventional MTCMOS circuit includes a logic circuit 11, a header type power gating circuit 12, a footer type power gating circuit 13, a virtual power voltage rail 14, and a virtual ground voltage rail 15.

The logic circuit 11 is coupled to the virtual power voltage rail 14 and to the virtual ground voltage rail 15, respectively. The logic circuit 11 is provided with a virtual power voltage and a virtual ground voltage. The logic circuit 11 includes MOS transistors having a low threshold voltage so that the logic circuit 11 can operate at a fast speed in a low voltage condition (for example, in a condition of about 1V). In FIG. 1, the logic circuit 11 may include the MOS transistor or a logic gate that has a low threshold voltage. In general, a drain current increases when the threshold voltage of the MOS transistor is lowered. Thus, the logic circuit 11 that includes transistors having the low threshold voltage can be switched quickly. However, when the threshold voltage of the MOS transistor is lowered, the leakage current increases rapidly even in a low voltage condition of 1V. Thus, the logic circuit 11 requires a means for blocking the leakage current in a stand-by mode.

The header type power gating circuit 12 includes a first current switch that connects or disconnects a power voltage terminal VDD and the virtual power voltage rail 14 in response to a control signal SLEEP. The footer type power gating circuit 13 includes a second current switch that connects or disconnects a ground voltage terminal GND and the virtual ground voltage rail 15 in response to an inversion signal /SLEEP of the control signal SLEEP. The first current switch and the second current switch may be implemented with a transistor having a high threshold voltage. Because a leakage current is very small in the transistor having a high threshold voltage, the leakage current of the logic circuit 11 is almost completely prevented when the first current switch and the second current switch using the transistor having a high threshold voltage is disconnected. When a semiconductor device is designed by applying the power gating method, a power consumption of the semiconductor device in a standby mode may be reduced.

The first current switch and the second current switch preferably do not affect the operation of the logic circuit 11. Because a current of the logic circuit 11 flows through the first current switch and the second current switch, the first current switch and the second current switch require a large current capacity. Accordingly an occupation area of the first current switch and the second current switch is very large.

The semiconductor device may have function cells that perform various functions, respectively. A particular function cell such as an output maintenance circuit that is always operated may not need the power gating method. In addition, it may be undesirable to apply the power gating method to all function cells since the MTCMOS occupies a large area. Accordingly the power gating method may be selectively applied to the function cell having a great need to reduce the power consumption in a standby mode so as to simultaneously satisfy a small size and a low power consumption. In other words, the particular function cell may have a general structure without adopting the power gating method whereas the function cell having the standby mode may have a structure with adopting the power gating method.

FIG. 2 is a diagram illustrating a standard power gating cell according to a conventional power gating method.

Referring to FIG. 2, the standard power gating cell has a structure in which a header type power gating circuit field is added to a general standard cell. The standard power gating cell includes an operating circuit field 21 that is coupled between a virtual power voltage rail 24 and a ground voltage rail 25, and a power gating circuit field 22 that is coupled between a power voltage rail 23 and the virtual power voltage rail 24.

A semiconductor device can be designed such that the standard power gating cells replace the general standard cells. In such conventional designs, however, the general standard cell and the standard power gating cell have to be included each process that requires power gating, thereby increasing workload and complexity of the conventional design processes. On the other hand, a semiconductor device can be designed such that the power gating method is adopted without changing a design of the general standard cell. For example, one independent power gating cell including the power gating circuit can be used with the general standard cell, but a following problem is accompanied. A source and a body of transistor elements in the general standard cell are connected to a virtual voltage rail, and a body of a current switch in the power gating circuit has to be electrically disconnected to the source and the body of transistor elements in the general standard cell. Otherwise, a leakage current through the body of the current switch and thus a power gating effect is reduced. Therefore the current switch has to be sufficiently separated from the general standard cell and a size of the current switch and a separation field need to be increased according as a current through the general standard cell connected to the current switch is increased. It is difficult to change a design of the power gating cell whenever the size of the current switch is changed. Therefore, a design of the power gating cell capable of being applied to the general standard cell is required.

SUMMARY OF THE INVENTION

Accordingly the present invention is provided to substantially obviate one or more problems due to limitations and disadvantages of the related art.

Some embodiments of the present invention provide a power gating cell capable of being designed conveniently.

Some embodiments of the present invention provide a semiconductor device that uses a general standard cell and a power gating cell.

Some embodiments of the present invention provide a power network for supplying a power with a general standard cell and a power gating cell.

In some embodiments of the present invention, a semiconductor device includes a standard cell and a power gating cell. The standard cell has an operating circuit that is provided with a virtual supply voltage through a virtual voltage rail and a first supply voltage through a first voltage rail. The power gating cell switches an electrical connection between a second voltage rail that is provided with a second supply voltage and the virtual voltage rail in response to a control signal. The virtual voltage rail and the first voltage rail are formed in a first metal layer. The second voltage rail is formed in a third metal layer different from the first metal layer and is arranged above the power gating cell.

In some embodiments, the operating circuit may include metal oxide semiconductor (MOS) transistors that have a relatively low threshold voltage and the power gating cell may include MOS transistors that have a relatively high threshold voltage.

In some embodiments, the first supply voltage may be lower than the second supply voltage and the power gating cell may correspond to a header type.

In some embodiments, the first supply voltage may be higher than the second supply voltage and the power gating cell may correspond to a footer type.

In some embodiments, the semiconductor device may further include a function cell that is provided with the first supply voltage and the second supply voltage.

In some embodiments of the present invention, a semiconductor device includes a standard cell, a first power gating cell and a second power gating cell. The standard cell has an operating circuit that is provided with a virtual power voltage through a virtual power voltage rail and is provided with a virtual ground voltage through a virtual ground voltage rail. The first power gating cell switches an electrical connection between a power voltage rail that is provided with a power voltage and the virtual power voltage rail in response to a control signal. The second power gating cell switches an electrical connection between a ground voltage rail that is provided with a ground voltage and the virtual ground voltage rail in response to an inverting signal of the control signal. The virtual power voltage rail and the virtual ground voltage rail are formed in a first metal layer. The power voltage rail is formed in a third metal layer different from the first metal layer, and the ground voltage rail is formed in a fourth metal layer different from the first metal layer and the third metal layer. The power voltage rail is arranged above the first power gating cell, and the ground voltage rail is arranged above the second power gating cell.

In some embodiments, the operating circuit may include metal oxide semiconductor (MOS) transistors that have a relatively low threshold voltage, the first power gating cell and the second power gating cell may include MOS transistors that have a relatively high threshold voltage.

In some embodiments, the semiconductor device may further include a function cell that is provided with the power voltage and the ground voltage.

In some embodiments of the present invention, a power gating cell includes at least one slice block, a first isolator block and a second isolator block. The at least one slice block includes a transistor that is in contact with a first supply voltage rail at a first electrode and is in contact with a virtual supply voltage rail at a second electrode and is out of contact with a second supply voltage rail. The first isolator block is arranged in a first side portion of the slice block and insulates the slice block from outside. The second isolator block is arranged in a second side portion of the slice block and insulates the slice block from outside.

In some embodiments, the first supply voltage may be higher than the second supply voltage and the slice blocks may include P-channel metal oxide semiconductor (PMOS) transistors.

In some embodiments, the first supply voltage may be lower than the second supply voltage and the slice blocks may include N-channel metal oxide semiconductor (NMOS) transistors.

In some embodiments of the present invention, a semiconductor device includes a standard cell, and a power gating cell. The standard cell has an operating circuit that is provided with a virtual supply voltage through a virtual voltage rail and is provided with a first supply voltage through a first voltage rail. The power gating cell has at least one slice block, a first isolator block, and a second isolator block. The at least one slice block includes a transistor that is in contact with a second voltage rail at a first electrode and is in contact with the virtual voltage rail at a second electrode and switches an electrical connection between the second voltage rail and the virtual voltage rail in response to a control signal. The first isolator block is arranged in a first side portion of the slice block and insulates the slice block from outside. The second isolator block is arranged in a second side portion of the slice block and insulates the slice block from outside. The virtual voltage rail and the first voltage rail are formed in a first metal layer. The second voltage rail is formed in a third metal layer different from the first metal layer and is arranged above the power gating cell.

In some embodiments, the operating circuit may include metal oxide semiconductor (MOS) transistors that have a relatively low threshold voltage and the power gating cell may include metal oxide semiconductor (MOS) transistors that have a relatively high threshold voltage.

In some embodiments, the first supply voltage may be lower than the second supply voltage and the power gating cell may correspond to a header type.

In some embodiments, the first supply voltage may be higher than the second supply voltage and the power gating cell may correspond to a footer type.

In some embodiments of the present invention, a semiconductor device includes a standard cell, a first power gating cell, and a second power gating cell. The standard cell has an operating circuit that is provided with a virtual power voltage through a virtual power voltage rail and is provided with a virtual ground voltage through a virtual ground voltage rail. The first power gating cell has at least one first slice block, a first isolator block, and a second isolator block. The at least one first slice block includes a P-channel metal oxide semiconductor (PMOS) transistor that is in contact with a power voltage rail at a first electrode and is in contact with the virtual power voltage rail at a second electrode and switches an electrical connection between the power voltage rail and the virtual power voltage rail in response to a control signal. The first isolator block is arranged in a first side portion of the first slice block and insulates the first slice block from outside. The second isolator block is arranged in a second side portion of the first slice block and insulates the first slice block from outside. The second power gating cell has at least one second slice block, a third isolator block, a fourth isolator block. The at least one second slice block includes a N-channel metal oxide semiconductor (NMOS) transistor that is in contact with a ground voltage rail at a first electrode and is in contact with the virtual ground voltage rail at a second electrode and switches an electrical connection between the ground voltage rail and the virtual ground voltage rail in response to an inverting signal of the control signal. The third isolator block is arranged in a first side portion of the second slice block and insulates the second slice block from outside. The fourth isolator block is arranged in a second side portion of the second slice block and insulates the second slice block from outside. The virtual power voltage rail and the virtual ground voltage rail are formed in a first metal layer. The power voltage rail is formed in a third metal layer different from the first metal layer, and the ground voltage rail is formed in a fourth metal layer different from the first metal layer and the third metal layer. The power voltage rail is arranged above the first power gating cell and the ground voltage rail is arranged above the second power gating cell.

In some embodiments, the operating circuit may include metal oxide semiconductor (MOS) transistors that have a relatively low threshold voltage, the first power gating cell and the second power gating cell may include metal oxide semiconductor (MOS) transistors that have a relatively high threshold voltage.

In some embodiments of the present invention, a power network suitable for a semiconductor device including a standard cell and a power gating cell. The power network includes a virtual voltage rail, a first voltage rail, and a second voltage rail. The virtual voltage rail is formed in a first metal layer and supplies the standard cell with a virtual supply voltage and is arranged above the standard cell and the power gating cell. The first voltage rail is formed in the first metal layer and supplies the standard cell with a first supply voltage and is arranged above the standard cell. The second voltage rail is formed in the third metal layer different from the first metal layer and supplies the power gating cell with a second supply voltage and is arranged above the power gating cell. The standard cell uses metal oxide semiconductor (MOS) transistors having a relatively low threshold voltage. The power gating cell switches an electrical connection between the virtual voltage rail and the second voltage rail in response to a control signal by using metal oxide semiconductor (MOS) transistors having a relatively high threshold voltage.

Therefore, the power gating cell of the footer type and the header type having various sizes may be easily designed and the power consumption may be reduced.

DESCRIPTION OF THE EMBODIMENTS

Figure 1:
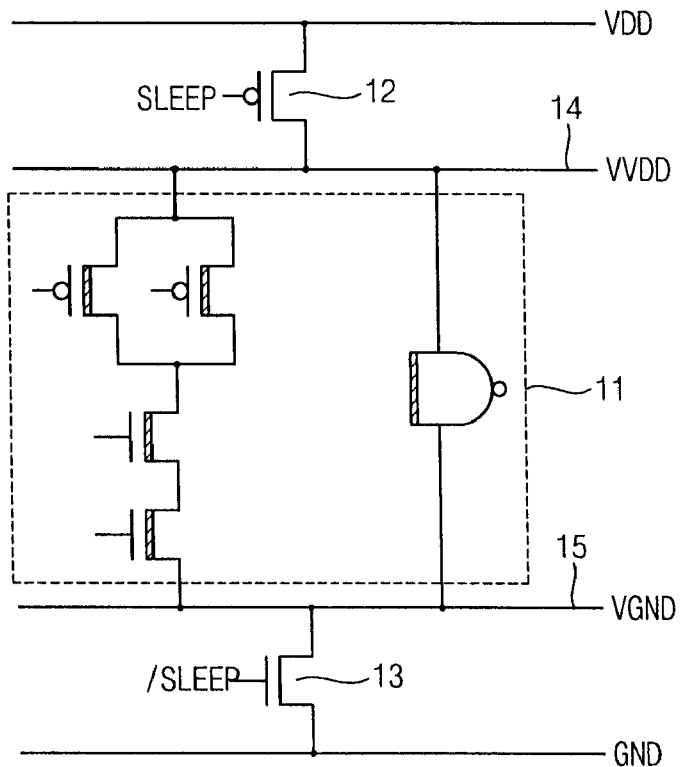
FIG. 1 is a circuit diagram illustrating a conventional MTCMOS circuit.
Figure 2:
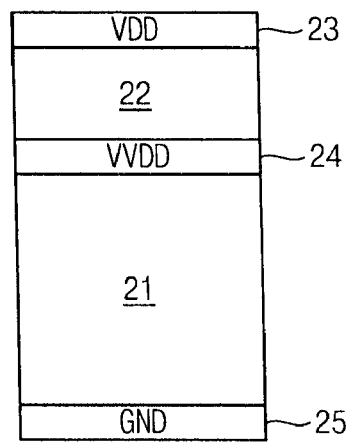
FIG. 2 is a diagram illustrating a standard power gating cell according to a conventional power gating method.

Embodiments of the present invention now will be described more fully with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 3:
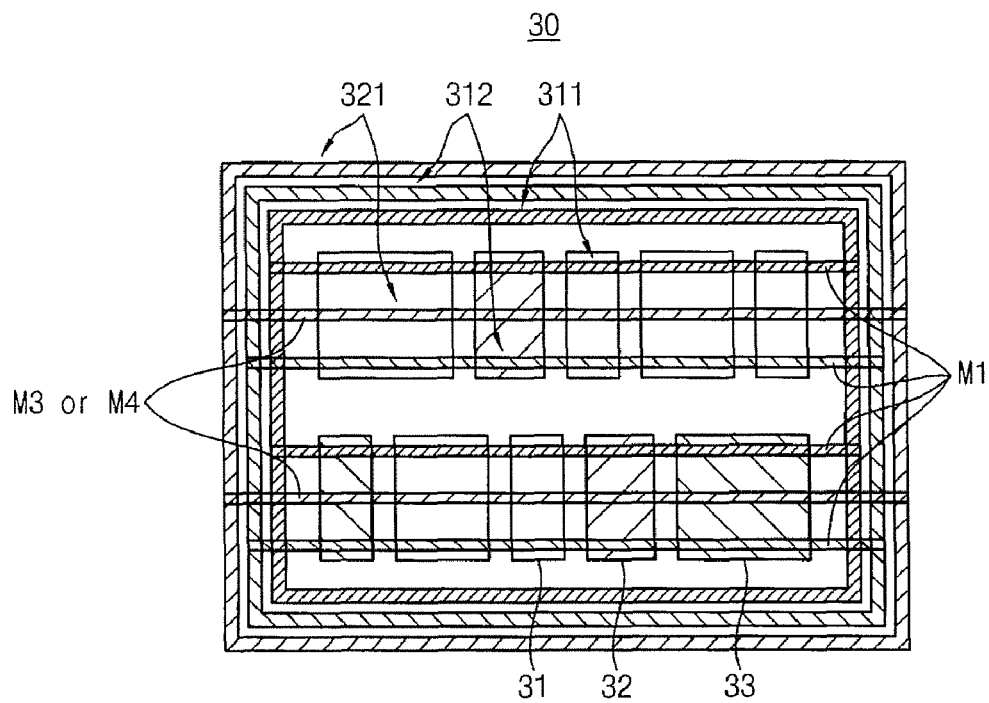
FIG. 3 is a diagram illustrating a semiconductor device adopting a power network according to an example embodiment of the present invention.

FIG. 3 is a diagram illustrating a semiconductor memory device adopting a power network according to an example embodiment of the present invention.

Referring to FIG. 3, the semiconductor device 30 includes a power network that provides a power through a virtual power voltage rail 311 and a ground voltage rail 312. The semiconductor device 30 adopting the power network includes various cells, arranged in several rows, such as a general standard cell 31, a power gating cell 32, a particular function cell 33, etc. The general standard cell 31 may include a logic circuit. The general standard cell 31 is contacted with the virtual power voltage rail 311 and the ground voltage rail 312, and is provided with the virtual power voltage VVDD and the ground voltage GND. The power gating cell 32 is contacted with a power voltage rail 321 and the virtual power voltage rail 311 and switches connection between the power voltage rail 321 and the virtual power voltage rail 311 in response to a control signal SLEEP. The particular function cell 33 includes an output maintenance circuit, a power gating register capable of retaining data, etc. The particular function cell 33 is contacted with the power voltage rail 321 and the ground voltage rail 312, and is provided with a power voltage VDD and the ground voltage GND. According to a function, the particular function cell 33 may be contacted with the virtual power voltage rail 311 and the ground voltage rail 312.

The virtual power voltage rail 311 and the ground voltage rail 312 are formed with respect to each row above the cells along a row direction. The power voltage rail 321 may be formed above centers of the power gating cell 32 and the particular function cell 33 in a direction parallel to the virtual power voltage rail 311 and the ground voltage rail 312. The virtual power voltage rail 311 may be formed at a first metal layer M1, and the ground voltage rail 312 may be formed at the first metal layer M1. In this case, the power voltage rail 321 may be formed at a metal layer, for example, a third metal layer M3 out of contact with the general standard cell 31. Therefore, the power voltage rail 321 may be electrically insulated with the general standard cell 31. The power voltage rail 321 may be formed on each row or may be formed at interval of two or three rows, on condition that the power voltage rail 321 does not interfere with routing of signal lines connected between other cells.

The power gating cell 32 includes a current switch connecting the power voltage rail 321 with the virtual power voltage rail 311. The current switch may have a regular standard layout. When the current switch requires large size according to an increase of current that is provided to the general standard cell 31, the current switch with a desirable size can be simply designed by replicating the regular standard layout.

The current switch may be p-channel metal oxide semiconductor (PMOS) transistor having a relatively high threshold voltage. In this case, the PMOS transistor may have a source that is contacted with the power voltage rail 321 above the center of the power gating cell 32 and is provided with the power voltage VDD. In addition, the PMOS transistor may have a gate to which the control signal SLEEP is applied, and may have a drain that is contacted with the virtual power voltage rail 311 and is provided with the virtual power voltage VVDD.

According to another embodiment of the present invention, the power network may include a power gating cell of a footer type. In this case, a general standard cell is contacted with a power voltage rail and a virtual ground voltage rail, and is provided with a power voltage and a virtual ground voltage. The power gating cell is contacted with the virtual ground voltage rail and a ground voltage rail, and switches connection between the virtual ground voltage rail and the ground voltage rail in response to a control signal. The particular function cell is contacted with the power voltage rail and the ground voltage rail, and is provided with the power voltage and the ground voltage. According to a function, the particular function cell may be contacted with the virtual power voltage rail and the ground voltage rail. The ground voltage rail may be formed by using a metal layer M4 that is out of contact with the general standard cell so that the ground voltage rail may be electrically insulated with the general standard cell. The ground voltage rail may be formed on the each row or may be formed at interval of two or three rows, on condition that the ground voltage rail does not interfere with routing of signal lines connected between other cells.

According to still another embodiment of the present invention, the power network may include a power gating cell of a header type and a power gating cell of a footer type. In this case, a general standard cell is contacted with a virtual power voltage rail and a virtual ground voltage rail, is provided with a virtual power voltage and a virtual ground voltage. A power voltage rail and a ground voltage rail may be formed by using a metal layer that is out of contact with the general standard cell so that the power voltage rail and the ground voltage rail may be electrically insulated with the general standard cell. The power voltage rail and the ground voltage rail may be formed on the each row or may be formed at interval of two or three rows, on condition that the ground voltage rail don't interfere with routing of signal lines connected between other cells.

Figure 4:
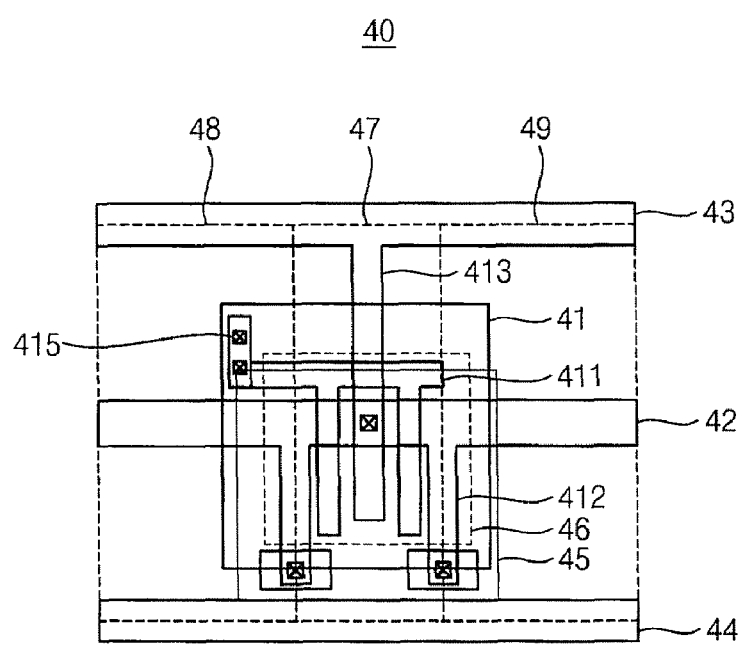
FIG. 4 is a diagram illustrating a layout of a power gating cell of a header type that has a slice block according to an example embodiment of the present invention.

FIG. 4 is a diagram illustrating a layout of a power gating cell of a header type that has a slice block according to an example embodiment of the present invention.

Referring to FIG. 4, the power gating cell 40 includes a current switch corresponding to a PMOS transistor 41. In this case, a gate 411 of the PMOS transistor 41 is contacted with a switch control signal rail 415, and a source 412 of the PMOS transistor 41 is contacted with a power voltage rail 42, and a drain 413 of the PMOS transistor 41 is contacted with a virtual power voltage rail 43, and body of the PMOS transistor is contacted with the power voltage rail 42. The virtual power voltage rail 43 is illustrated in an upper portion of the layout and a ground voltage rail 44 is illustrated in a lower portion of the layout. The power voltage rail 42 is illustrated in a center portion of the layout by a horizontal line. The ground voltage rail 44 is out of contact with the PMOS transistor 41. A thick solid line represents the transistor 41 having a high threshold voltage. An area surrounded by a thin solid line 45 represents an N-type well that is formed in a P-type body forming the PMOS transistor 41. An area surrounded by a thin dotted line 46 represents an active field of the PMOS transistor 41. The well area of the PMOS transistor 41 is separated from a neighbor cell, and is segregated from the virtual power voltage rail 43 by a predetermined interval, respectively.

The power gating cell 40 may be divided into a slice block 47 of the center and isolator blocks 48 and 49 of the both sides. The slice block 47 corresponds to an area where the PMOS transistor 41 is arranged in the center of the layout. Outside areas of the contacts of the power voltage rail 42 and the drain 413 correspond to the isolator blocks 48 and 49.

According to embodiments of the present invention, a relative position of the power voltage rail 42 and the ground voltage rail 44 may be altered.

Although FIG. 4 illustrates the power gating cell of the header type, the present invention may be applied to the power gating cell of a footer type. For example, the power gating cell of the footer type includes NMOS transistor that is arranged between a virtual ground voltage rail and a ground voltage rail. A gate of the NMOS transistor may be contacted with a control signal rail that is provided with an inversion signal /SLEEP of the switch control signal SLEEP, and a source of the NMOS transistor may be contacted with the ground voltage rail, and a drain of the NMOS transistor may be contacted with the virtual ground voltage rail.

Figure 5:
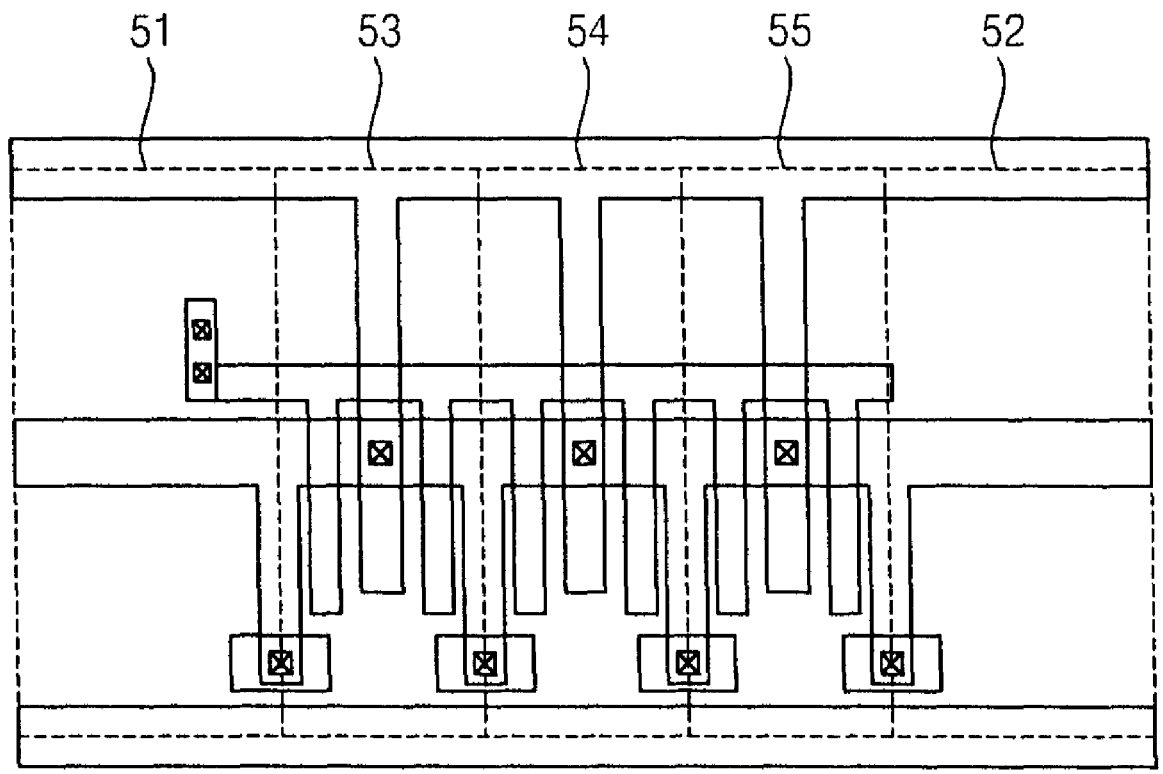
FIG. 5 is a diagram illustrating a layout of a power gating cell of a header type that has a plurality of slice blocks according to another example embodiment of the present invention.

FIG. 5 is a diagram illustrating a layout of a power gating cell of a header type that has a plurality of slice blocks according to another example embodiment of the present invention.

The number of the slice blocks of the power gating cell 50 may be increased so as to allow a current greater than that of the power gating cell 40 having one slice block in FIG. 4.

Referring to FIG. 5, the power gating cell 50 includes an isolator block 51 at a left side and an isolator block 52 at a right side, and slice blocks 53, 54, and 55 that are consecutively arranged between the isolator blocks 51 and 52. In this case, the number of the slice blocks 53, 54, and 55 may be determined according to a desirable current capacity. Accordingly the power gating cell having a proper size can be conveniently designed depending on various current capacities.

The present invention may be applied to the power gating cell of a footer type. For example, the power gating cell of the footer type includes a plurality of slice blocks that are arranged between a virtual ground voltage rail and a ground voltage rail, and includes two isolator blocks that are arranged both sides of the plurality of slice blocks. The plurality of slice blocks include NMOS transistors. A gate of the NMOS transistor may be contacted with a control signal rail that is provided with an inversion signal/SLEEP of a switch control signal SLEEP, and a source of the NMOS transistor may be contacted with the ground voltage rail, and a drain of the NMOS transistor may be contacted with the virtual ground voltage rail.

As mentioned above, the power gating cell of the footer type and the header type having various sizes according to some example embodiments of the present invention may be easily designed. In addition, the power consumption of a semiconductor device adopting the power network that uses a general standard cell according to the present invention may be reduced by arranging the power voltage rail and the ground voltage rail in a metal layer different from a metal layer of a virtual power voltage rail and a virtual ground voltage rail above the power gating cell, and thus the design of the semiconductor device adopting the power network may be accomplished easily.

While the example embodiments of the present invention and their advantages have been described in detail, it should be understood that various changes, substitutions and alterations may be made herein without departing from the scope of the invention.

What is claimed is:

1. A semiconductor device comprising:
a standard cell having an operating circuit that is provided with a virtual supply voltage through a virtual voltage rail and is provided with a first supply voltage through a first voltage rail; and
a power gating cell having:
at least one slice block that includes a transistor that is in contact with a second voltage rail at a first electrode and is in contact with the virtual voltage rail at a second electrode and switches an electrical connection between the second voltage rail and the virtual voltage rail in response to a control signal;
a first isolator block that is arranged in a first side portion of the slice block and insulates the slice block from outside; and
a second isolator block that is arranged in a second side portion of the slice block and insulates the slice block from outside, the virtual voltage rail and the first voltage rail being formed in a first metal layer, the second voltage rail being formed in a third metal layer different from the first metal layer and being arranged above the power gating cell.

2. The semiconductor device of claim 1, wherein the operating circuit includes metal oxide semiconductor (MOS) transistors that have a first threshold voltage and the power gating cell includes metal oxide semiconductor (MOS) transistors that have a second threshold voltage, the second threshold voltage being higher than the first threshold voltage.

3. The semiconductor device of claim 1, wherein the first supply voltage is lower than a second supply voltage and the power gating cell corresponds to a header type.

4. The semiconductor device of claim 1, wherein the first supply voltage is higher than a second supply voltage and the power gating cell corresponds to a footer type.

5. A semiconductor device comprising:
a standard cell having an operating circuit that is provided with a virtual power voltage through a virtual power voltage rail and is provided with a virtual ground voltage through a virtual ground voltage rail;
a first power gating cell; and
a second power gating cell,
wherein the first power gating cell comprises:
at least one first slice block that includes a P-channel metal oxide semiconductor (PMOS) transistor that is in contact with a power voltage rail at a first electrode and is in contact with the virtual power voltage rail at a second electrode and switches an electrical connection between the power voltage rail and the virtual power voltage rail in response to a control signal;
a first isolator block that is arranged in a first side portion of the first slice block and insulates the first slice block from outside; and
a second isolator block that is arranged in a second side portion of the first slice block and insulates the first slice block from outside,
wherein the second power gating cell comprises:
at least one second slice block that includes a N-channel metal oxide semiconductor (NMOS) transistor that is in contact with a ground voltage rail at a first electrode and is in contact with the virtual ground voltage rail at a second electrode and switches an electrical connection between the ground voltage rail and the virtual ground voltage rail in response to an inverting signal of the control signal;
a third isolator block that is arranged in a first side portion of the second slice block and insulates the second slice block from outside; and
a fourth isolator block that is arranged in a second side portion of the second slice block and insulates the second slice block from outside, and
wherein the virtual power voltage rail and the virtual ground voltage rail are formed in a first metal layer, the power voltage rail is formed in a third metal layer different from the first metal layer, the ground voltage rail is formed in a fourth metal layer different from the first metal layer and the third metal layer, the power voltage rail is arranged above the first power gating cell, and the ground voltage rail is arranged above the second power gating cell.

6. The semiconductor device of claim 5, wherein the operating circuit includes metal oxide semiconductor (MOS) transistors that have a first threshold voltage, the first power gating cell and the second power gating cell includes metal oxide semiconductor (MOS) transistors that have a second threshold voltage and a third threshold voltage respectively, the second and third threshold voltages being higher than the first threshold voltage.

* * * * *